(12) United States Patent
Roos et al.

(10) Patent No.: US 8,884,238 B2
(45) Date of Patent: Nov. 11, 2014

(54) X-RAY MATRIX IMAGER

(75) Inventors: Pieter Gerhard Roos, Sandy, UT (US);
Ivan P. Mollov, Mountain View, CA (US); Richard E. Colbeth, Los Altos, CA (US)

(73) Assignee: Varian Medical Systems, Inc., Palo Alto, CA (US)

( * ) Notice: Subject to any disclaimer, the term of this patent is extended or adjusted under 35 U.S.C. 154(b) by 193 days.

(21) Appl. No.: 13/420,928

(22) Filed: Mar. 15, 2012

(65) Prior Publication Data

US 2013/0240745 A1    Sep. 19, 2013

(51) Int. Cl.
*G01T 1/24*    (2006.01)

(52) U.S. Cl.
USPC .................................. 250/370.09; 250/370.08

(58) Field of Classification Search
USPC ........................... 250/370.01, 370.08, 370.09
See application file for complete search history.

(56) References Cited

U.S. PATENT DOCUMENTS

| 7,619,197 B2 | 11/2009 | Tredwell et al. |
| 7,902,514 B2 | 3/2011 | Miyako et al. |
| 2011/0303849 A1 | 12/2011 | Tredwell et al. |

FOREIGN PATENT DOCUMENTS

WO     9742661 A1    11/1997

OTHER PUBLICATIONS

Notification of Transmittal of the International Search Report and the Written Opinion of the International Searching Authority, PCT/US13/31113, May 28, 2013.

*Primary Examiner* — Mark R Gaworecki
(74) *Attorney, Agent, or Firm* — Su IP Consulting

(57) ABSTRACT

An X-Ray matrix imager includes a matrix, a plurality of gate line sets, and a plurality of data lines. The matrix includes a plurality of rows of pixels configured to accumulate charges in response to light or radiation. Each of the gate line sets includes a first gate line coupled to a first pixel among a first row of pixels of the matrix, and a second gate line coupled to a second pixel among the first row of pixels of the matrix, wherein the first pixel is adjacent to the second pixel. Each of the data lines is arranged to be coupled to the plurality of gate line sets for receiving charges accumulated on the first row of pixels. The X-Ray matrix imager is configured to operate based on multiple-gate-line driving scheme and shared-data-line driving scheme.

17 Claims, 8 Drawing Sheets

X-RAY MATRIX IMAGER

BACKGROUND

Unless otherwise indicated herein, the approaches described in this section are not prior art to the claims in this application and are not admitted to be prior art by inclusion in this section.

Various techniques have been developed for obtaining digital X-ray and gamma ray images of an object for purposes such as X-ray diagnostics, medical radiology, non-destructive testing, and so on. In one conventional approach, a flat-panel, two-dimensional, digital X-ray imager may include a plurality of detecting pixels formed on a silicon substrate. However, due to size restrictions of silicon wafers, multiple patched wafers are normally required for large-sized imagers. In another conventional approach, a matrix of detecting pixels may be formed on a single large glass substrate, instead of multiple silicon wafers. This approach requires the use of external circuits to drive and detect signals from the matrix of pixels. A high-resolution X-ray matrix imager requires small pixel pitches so that more connections to external driving circuits are required. It is however difficult to achieve pixel pitches that are smaller than 100 um on a glass substrate, due to the high density of connections, and such a bottleneck often limits the resolution of the matrix imager.

SUMMARY

In at least some embodiments of the present disclosure, a matrix imager includes a matrix, a plurality of gate line sets, and a plurality of data lines. The matrix includes a plurality of rows of pixels configured to accumulate charges in response to light or radiation. Each of the gate line sets includes a first gate line coupled to a first pixel among a first row of pixels of the matrix, and a second gate line coupled to a second pixel among the first row of pixels of the matrix, wherein the first pixel is adjacent to the second pixel. Each of the data lines is arranged to be coupled to the plurality of gate line sets for receiving charges accumulated on the first row of pixels The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
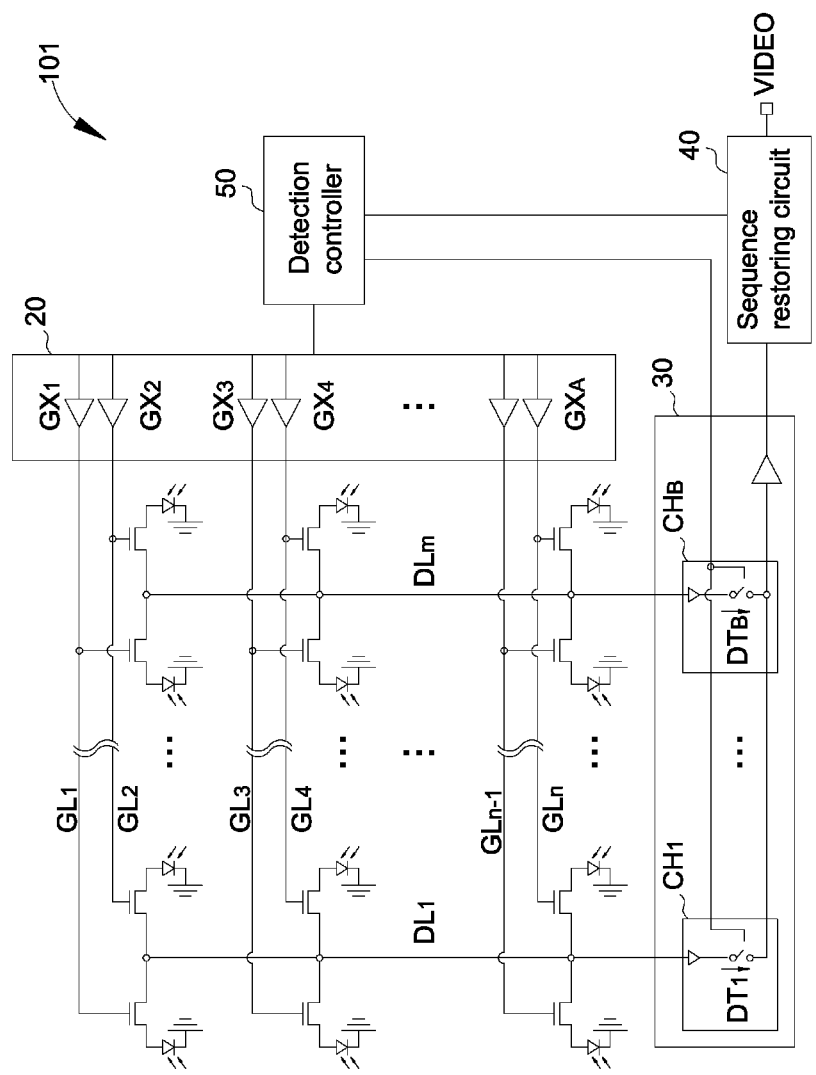
FIGS. 1-7 are example matrix imagers configured to obtain X-ray images in accordance with at least some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein. The mirror image nature of the pixels in adjacent columns is an artifact of the drawing style and is not material to this disclosure. Pixels in adjacent columns may be identical or the layout may be tailored to ease design of the matrix.

FIGS. 1-7 are example embodiments of matrix imagers 101-107 configured to obtain X-ray images in accordance with at least some embodiments of the present disclosure. Each of the matrix imagers 101-107 may include a pixel matrix having M columns and N rows, a plurality of gate lines $GL_1$-$GL_n$, a plurality of data lines $DL_1$-$DL_m$, a selecting circuit 20, a read-out circuit 30, a sequence restoring circuit 40, and a detection controller 50 (M is a positive even integer, and N, m, n are positive integers). The M by N pixel matrix may include a plurality of pixels configured to accumulate charges in response to light or radiation. In one embodiment, each pixel may include, but not limited to, a photodiode and a switch, such as a field-effect transistor (FET), thin-film transistor (TFT), or diode.

The selecting circuit 20 may include a plurality of gate drivers $GX_1$-$GX_A$ (A is a positive even integer) configured to generate select signals for turning on the switches in corresponding rows of pixels. Charges accumulated in each selected pixel may then be transferred to the read-out circuit 30 via a corresponding data line.

The read-out circuit 30 may include a plurality of charge amplifier channels $CH_1$-$CH_B$ (B is a positive integer) each coupled to one or more of the data lines $DL_1$-$DL_m$. Charges deposited on each data line may be collected, amplified and processed by a corresponding charge amplifier channel for generating corresponding electrical signals $DT_1$-$DT_B$.

The pixels, the gate lines, and the data lines of the matrix imagers 101-107 may be arranged in a shared data line structure. Each pair of two adjacent columns of pixels may be coupled to a communal data line on opposite sides (m=M/2). Each row of pixels may be coupled to a corresponding gate line set which includes two or more adjacent gate lines. Various embodiments illustrating the shared data line structure will be described in more details in subsequent paragraphs.

The detection controller 50 may be configured to control the operations of the selecting circuit 20, the read-out circuit 30, and/or the sequence restoring circuit 40. Since multiple pixels on the same row share a communal data line, a driving scheme using multiple-gate-line selection may be utilized for transmitting accumulated charges of each pixel to the communal data line in a predetermined sequence. Since pixel data is no longer read out in a raster pattern which can be processed or displayed by conventional video equipment, the sequence restoring circuit 40 may be configured to store the electrical signals $DT_1$-$DT_B$ received from the read-out circuit 30 sequentially and output each stored electrical signal with a certain amount of delay, thereby generating a video signal VIDEO in a required raster pattern. The sequence restoration may alternatively be implemented in software, running on an external image processing computer.

Figure 2:
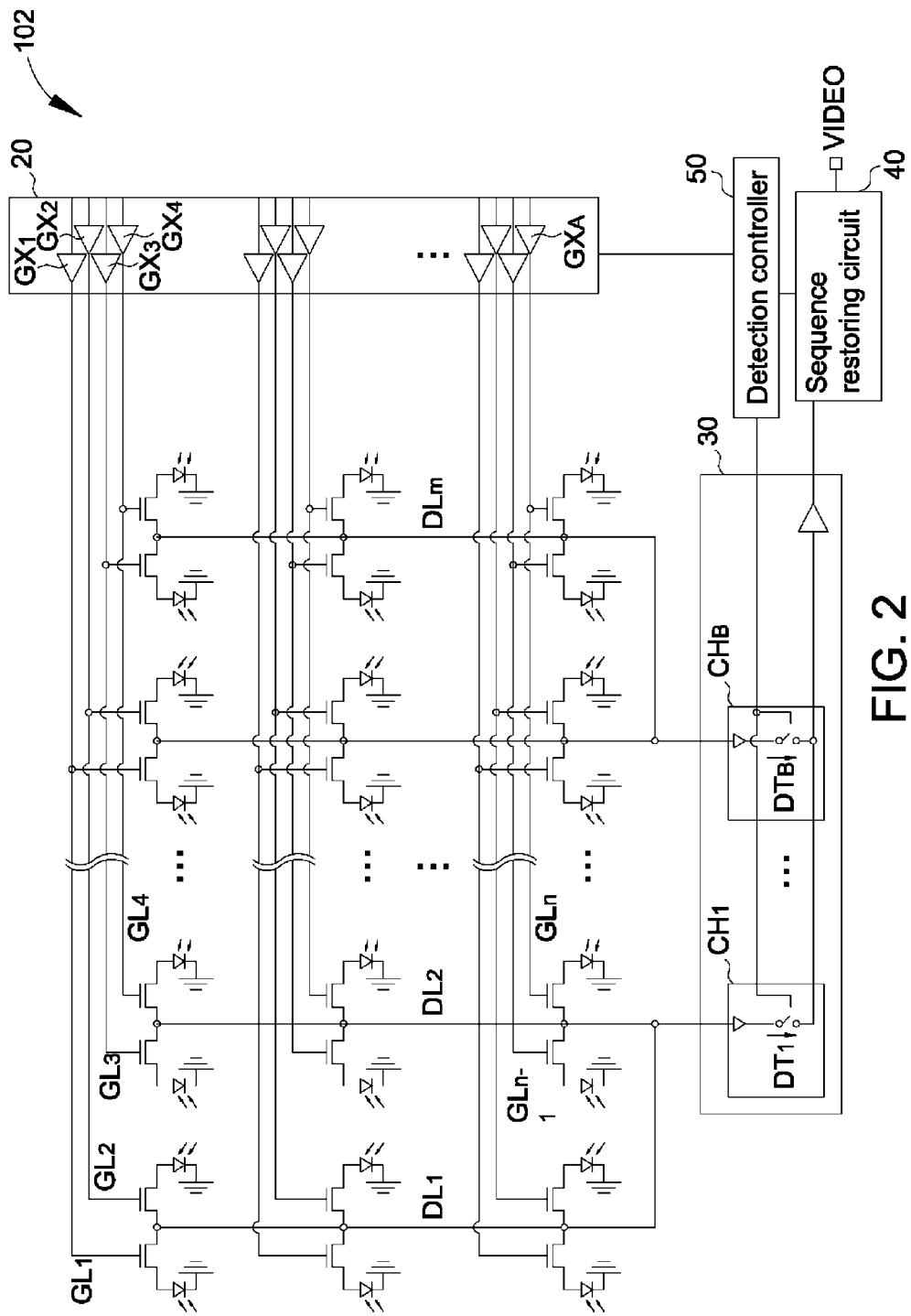

As depicted in FIGS. 1 and 2, the matrix imagers 101 and 102 are configured to operate based on a single-sided multiple-gate-line driving scheme and a shared-data-line driving scheme with $2^Y$:1 column-multiplexing. The selecting circuit 20 of the matrix imagers 101 and 102 includes A gate drivers $GX_1$-$GX_A$ disposed on one side of the pixel matrix and coupled to the gate lines $GL_1$-$GL_n$, respectively, wherein $A=n=2^Y*N$. The read-out circuit 30 of the matrix imagers 101 and 102 includes B charge amplifier channels $CH_1$-$CH_B$ each coupled to Y adjacent data lines among the data lines $DL_1$-$DL_m$, wherein $B=M/2^Y$.

FIG. 1 depicts a configuration when Y=1 (i.e., 2:1 column-multiplexing), in which each charge amplifier channel is coupled to a corresponding data line shared by two columns of pixels. When operating the M by N pixel matrix of the matrix imager 101, the number of the required data lines and the required charge amplifier channels in the read-out circuit 30 may be lowered to M/2, but the number of the required gate lines and the gate drivers in the selecting circuit 20 may need to be increased to 2N. Since the read-out circuit 30 is likely more complicated and expensive than the selecting circuit 20, a significant reduction (e.g., 50% deduction) of the data lines and the charge amplifier channels in the read-out circuit 30 may allow larger pitch widths without significantly increasing manufacturing costs or design complicity of the matrix imager 101.

FIG. 2 depicts a configuration when Y=2 (i.e., 4:1 column-multiplexing), in which each charge amplifier channel is coupled to two corresponding data lines each shared by two columns of pixels. When operating the M by N pixel matrix of the matrix imager 102, the number of the required data lines may be lowered to M/2, and the number of the required charge amplifier channels in the read-out circuit 30 may be lowered to M/4, but the number of the required gate lines and the gate drivers in the selecting circuit 20 may need to be increased to 4N. Since the read-out circuit 30 is more complicated and expensive than the selecting circuit 20, the reduction of the data lines and the charge amplifier channels in the read-out circuit 30 may allow larger pitch widths without significantly increasing manufacturing costs or design complicity.

Figure 3:
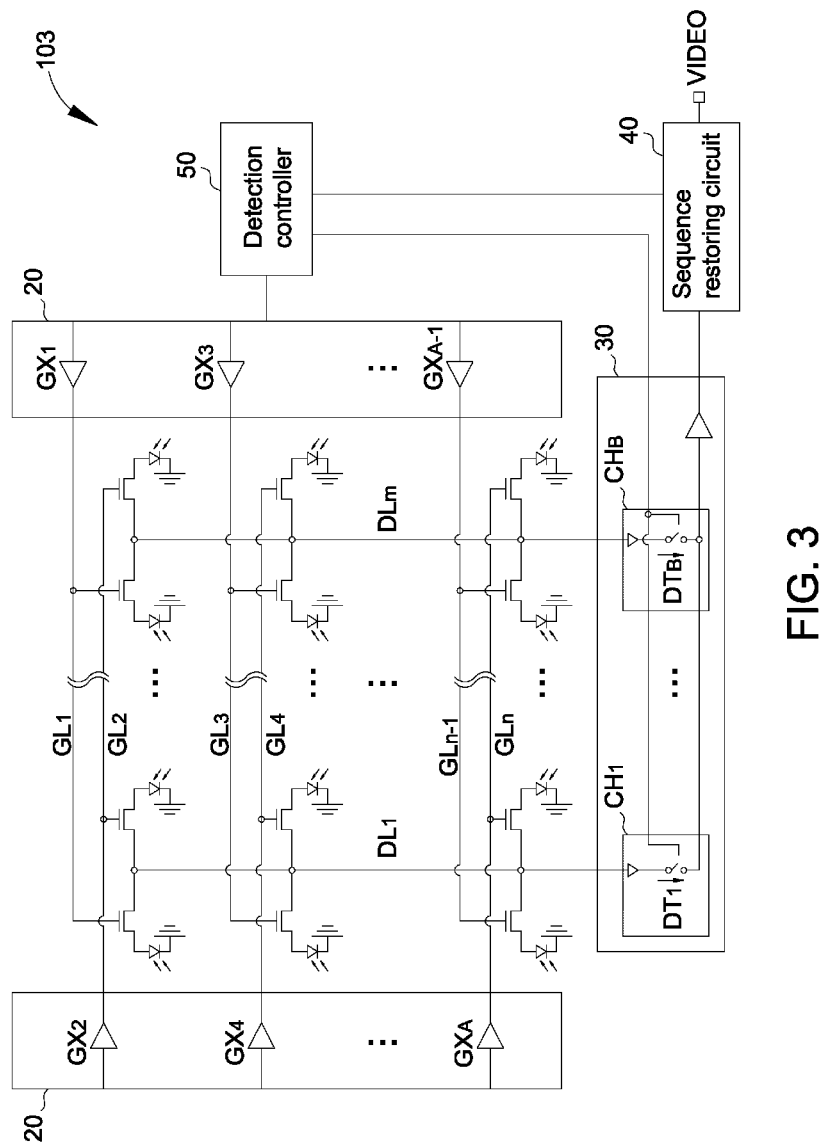

In the illustrative embodiment depicted in FIG. 3, the matrix imager 103 is configured to operate based on a dual-sided multiple-gate-line driving scheme and a shared-data-line driving scheme with $2^Y$:1 column-multiplexing. The selecting circuit 20 of the matrix imager 103 may include A gate drivers $GX_1$-$GX_A$ disposed on opposites sides of the pixel matrix and coupled to the gate lines $GL_1$-$GL_n$, respectively, wherein $A=n=2^Y*N$. The read-out circuit 30 of the matrix imager 103 may include B charge amplifier channels $CH_1$-$CH_B$, each coupled to Y adjacent data lines among the data lines $DL_1$-$DL_m$, wherein $B=m=M/2^Y$.

To illustrate, FIG. 3 depicts a configuration when Y=1 (i.e., 2:1 column-multiplexing), in which the number of the required data lines and the required charge amplifier channels in the read-out circuit 30 may be lowered to M/2. In an embodiment of the matrix imager 103, odd-numbered gate drivers $GX_1$, $GX_3$, . . . , $GX_{A-1}$ are disposed on the right side of the pixel matrix and even-numbered gate drivers $GX_2$, $GX_4$, . . . , $GX_A$ are disposed on the left side of the pixel matrix. The matrix imager 103 may adopt a dual-sided multiple-gate-line scheme, in which two opposite sides of the pixel matrix where the gate drivers are disposed may have similar interconnection densities. Meanwhile, opposite to a third side of the pixel matrix where the read-out circuit 30, the sequence restoring circuit 40 and the detection controller 50 are disposed, a fourth side of the pixel matrix may be free of any interconnection or external circuits. This dual-sided multiple-gate-line scheme may facilitate an image system capable of acquiring image data close to one of the physical edges for mammographic imaging in a high-resolution imaging system.

Figure 4:
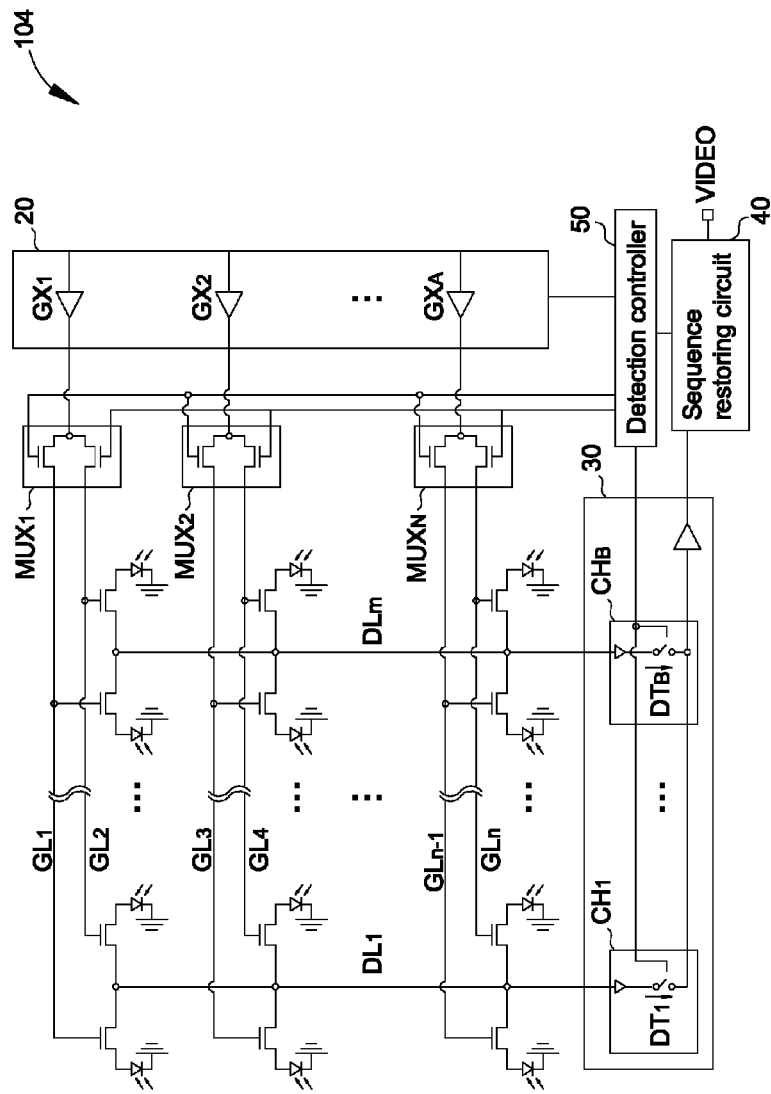
Figure 5:
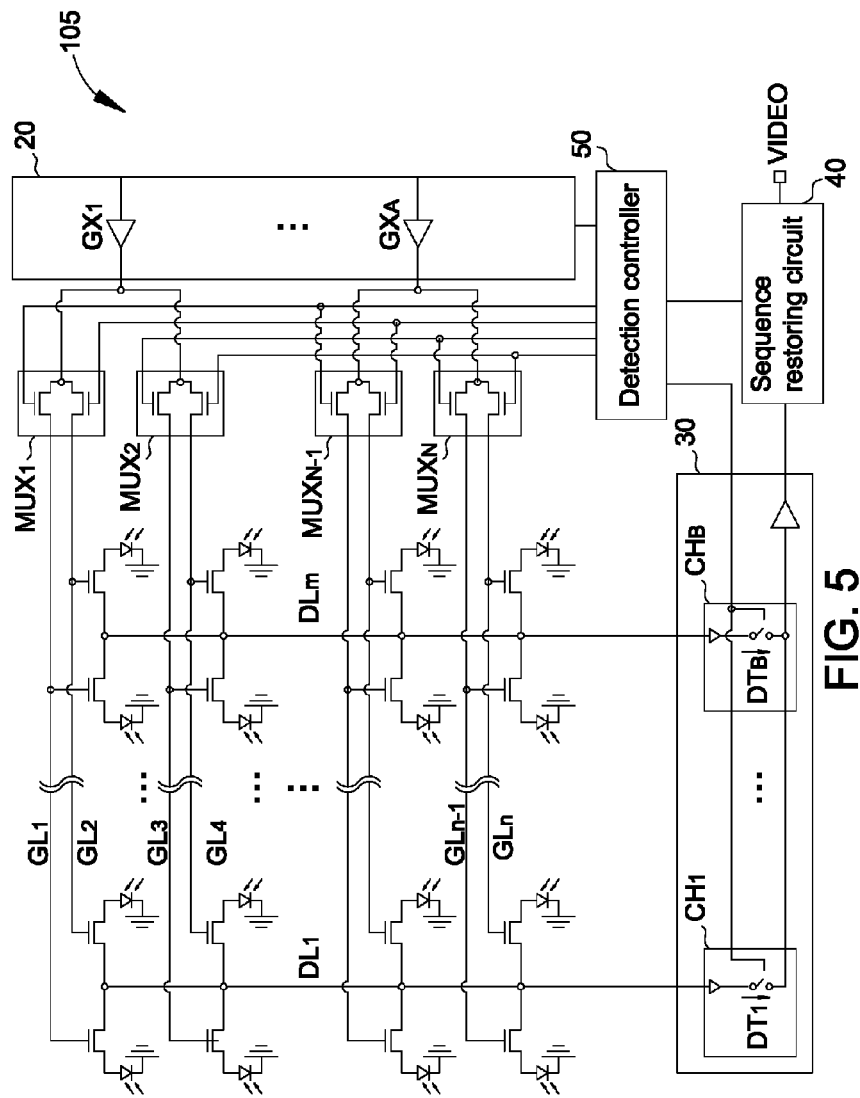

In the illustrative embodiments depicted in FIGS. 4 and 5, the matrix imagers 104 and 105 are configured to operate based on a single-sided multiple-gate-line driving scheme with X:1 row-multiplexing and a shared-data-line driving scheme with $2^Y$:1 column-multiplexing. The selecting circuit 20 of the matrix imagers 104 and 105 may include A gate drivers $GX_1$-$GX_A$ disposed on one side of the pixel matrix, wherein $A=A=n/X=(2^Y/X)*N$. The read-out circuit 30 of the matrix imagers 104 and 105 may include B charge amplifier channels $CH_1$-$CH_B$ coupled to Y adjacent data lines among the data lines $DL_1$-$DL_m$, wherein $B=M/2^Y$. The matrix imagers 104 and 105 each further may include N rows multiplexers $MUX_1$-$MUX_N$ coupled between the gate drivers $GX_1$-$GX_A$ and the gate line sets each including $2^Y$ adjacent gate lines. Each gate driver may be selectively coupled to one of the $2^Y$ gate lines in a corresponding gate line set via a corresponding row multiplexer, which may be controlled by the detection controller 50.

FIG. 4 depicts a configuration when X=2 and Y=1 (i.e., 2:1 row-multiplexing and 2:1 column-multiplexing), in which each gate driver may be selectively coupled to one of two gate lines in a corresponding gate line set, and each charge amplifier channel may be coupled to a corresponding data line. When operating the M by N pixel matrix of the matrix imager 104, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 104 may be further reduced without increasing the number of the required gate drivers in the selecting circuit 20.

FIG. 5 depicts a configuration when X=4 and Y=1 (i.e., 4:1 row-multiplexing and 2:1 column-multiplexing), in which each gate driver may be selectively coupled to one of the four gate lines in two corresponding gate line sets, and each charge amplifier channel may be coupled to a corresponding data line. When operating the M by N pixel matrix of the matrix imager 105, the number of the required data lines and the required charge amplifier channels in the read-out circuit 30 may be lowered to M/2, and the number of the required gate lines may need to be increased to 2N. However, the number of the required gate drivers in the selecting circuit 20 may be lowered to N/2 using the row multiplexers. Therefore, the number of the required charge amplifier channels in the read-out circuit 30 of the matrix imager 105 may be further reduced without increasing the number of the required gate drivers in the selecting circuit 20.

Figure 6:
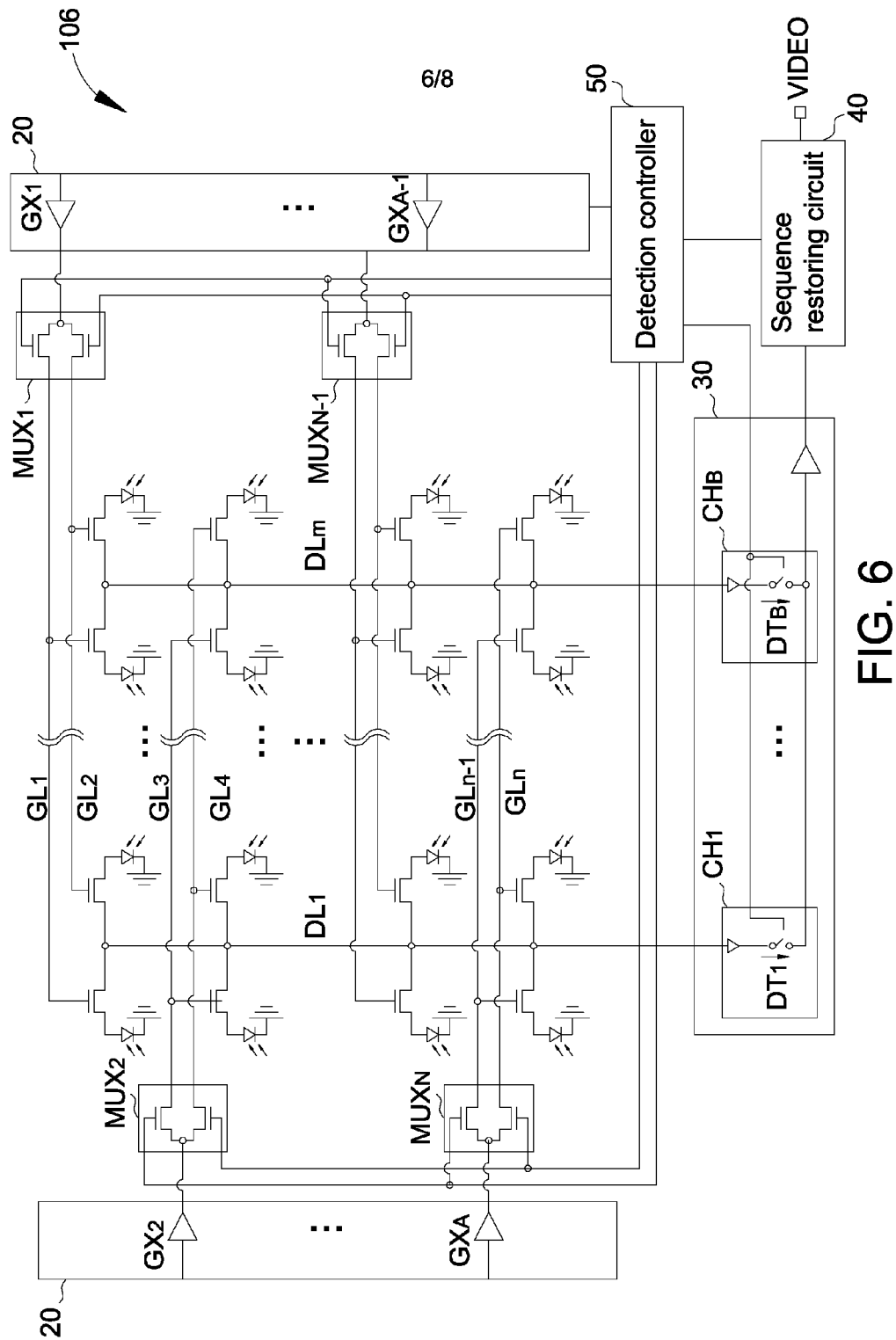
Figure 7:
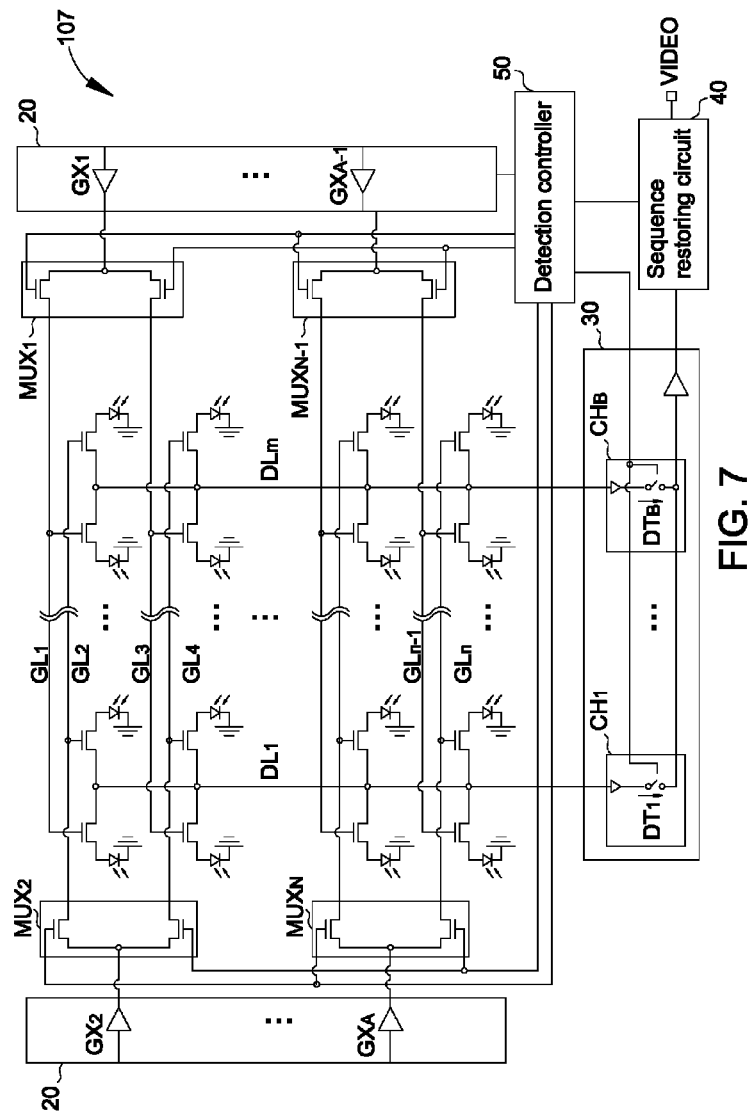

In the illustrative embodiments depicted in FIGS. 6 and 7, the matrix imagers 106 and 107 are configured to operate based on a dual-sided multiple-gate-line driving scheme with X:1 row-multiplexing and a shared-data-line driving scheme with $2^Y$:1 column-multiplexing. The selecting circuit 20 of the matrix imagers 106 and 107 may include A gate drivers $GX_1$-$GX_A$ disposed on opposite sides of the pixel matrix, wherein $A=n/X=(2^Y/X)*N$. The read-out circuit 30 of the matrix imagers 106 and 107 may include B charge amplifier channels $CH_1$-$CH_B$ coupled to Y adjacent data lines among the data lines $DL_1$-$DL_m$, wherein $B=M/2^Y$. The matrix imagers 106 and 107 each further may include N row multiplexers $MUX_1$-$MUX_N$ coupled between the gate drivers $GX_1$-$GX_A$ and the gate line sets each including $2^Y$ adjacent gate lines. Each gate driver may be selectively coupled to one of the $2^Y$ gate lines in one or more corresponding gate line sets via a corresponding row multiplexer, which may be controlled by the detection controller 50.

FIG. 6 depicts a configuration when X=2 and Y=1 (i.e., 2:1 row-multiplexing and 2:1 column-multiplexing), in which each gate driver may be selectively coupled to one of the two gate lines in a corresponding gate line set on a corresponding side of the pixel matrix, and each charge amplifier channel may be coupled to a corresponding data line. When operating the M by N pixel matrix of the matrix imager 106, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 106 may be further reduced without increasing the number of the required gate drivers in the selecting circuit 20. The matrix imager 106 may be configured to acquire image data close to one of the physical edges for mammographic imaging in a high-resolution imaging system.

FIG. 7 depicts a configuration when X=2 and Y=1 (i.e., 2:1 row-multiplexing and 2:1 column-multiplexing), in which each gate driver may be selectively coupled to one of the two gate lines in two corresponding gate line sets on a corresponding side of the pixel matrix, and each charge amplifier channel may be coupled to a corresponding data line. When operating the M by N pixel matrix of the matrix imager 107, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 107 may be further reduced without increasing the number of the required gate drivers in the selecting circuit 20. The matrix imager 107 may also be configured to acquire image data very close to one of the physical edges for mammographic imaging in a high-resolution imaging system.

Figure 8:
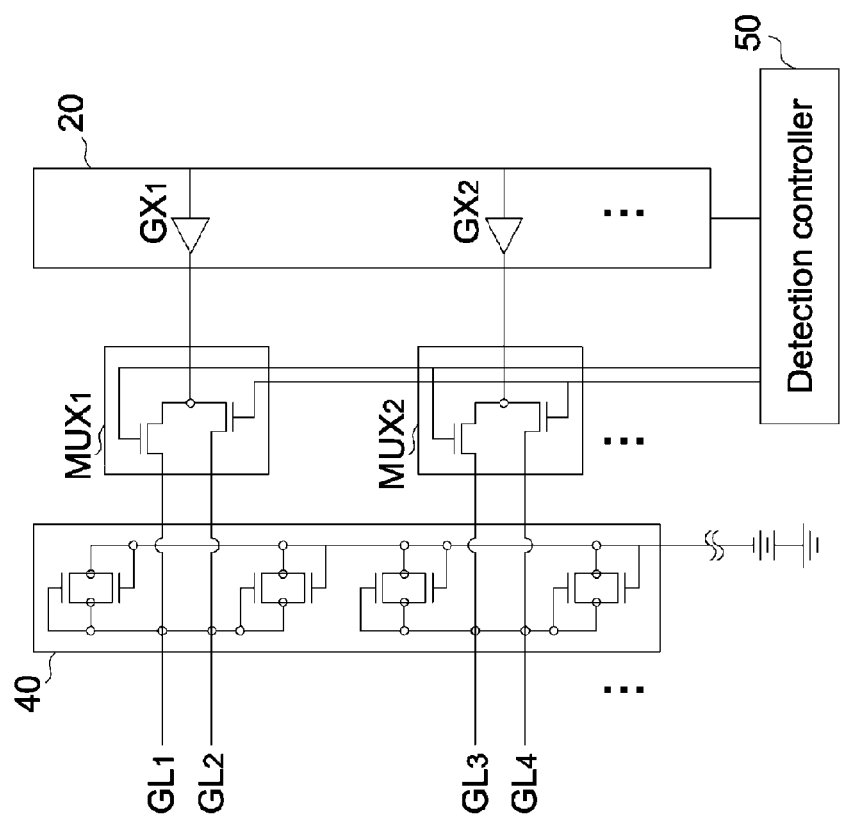
FIG. 8 illustrates an embodiment of a resistor circuit using MOS transistors.

In the embodiments illustrated in FIGS. 4-7, the introduction of the row multiplexers may render some gate lines floating. Unselected floating gate lines may cause unintended effects, such as, without limitation, pixel switching or crosstalk, between rows of pixels. Therefore, in accordance with one embodiment of the present application, a high-impedance resistor circuit may be included in a matrix imager, and the resistor circuit may be arranged to keep all unselected gate lines at a level which does not turn on the pixels. FIG. 8 illustrates an embodiment of a resistor circuit using MOS transistors. For the embodiments based on a dual-sided multiple-gate-line driving scheme as illustrated FIGS. 3, 6 and 7, MOS transistors of the resistor circuit may be disposed on opposite sides of the pixel matrix.

Although the present disclosure has been described with reference to specific exemplary embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

The invention claimed is:

1. A matrix imager, comprising:
a matrix having a plurality of rows of pixels configured to accumulate charges in response to light or radiation;
a plurality of gate line sets, each gate line set including:
a first gate line coupled to a first pixel among a first row of pixels of the matrix, and
a second gate line coupled to a second pixel among the first row of pixels of the matrix, wherein the first pixel is adjacent to the second pixel; and
a plurality of data lines, each arranged to be coupled to both the first pixel and the second pixel driven by each of the plurality of gate line sets to receive charges accumulated on the first pixel and the second pixel.

2. The matrix imager of claim 1, wherein:
the first pixel is coupled to a first data line among the plurality of data lines on a first side of the first data line; and
the second pixel is coupled to the first data line on a second side of the first data line opposite to the first side of the first data line.

3. The matrix imager of claim 2, wherein:
the first gate line is further coupled to a third pixel among the first row of pixels of the matrix; and
the second gate line is further coupled to a fourth pixel among the first row of pixels of the matrix, wherein the third pixel is coupled to a second data line among the plurality of data lines on the first side of the second data line, the fourth pixel is coupled to the second data line on the second side of the second data line, and the first data line is adjacent to the second data line.

4. The matrix imager of claim 2, wherein each gate line set further includes:
a third gate line coupled to a third pixel among the first row of pixels of the matrix; and
a fourth gate line coupled to a fourth pixel among the first row of pixels of the matrix, wherein the third pixel is coupled to a second data line among the plurality of data lines on the first side of the second data line, the fourth pixel is coupled to the second data line on the second side of the second data line, and the first data line is adjacent to the second data line.

5. The matrix imager of claim 1, further comprising:
a first gate driver coupled to the first gate line and configured to provide a first select signal for turning on the first pixel; and
a second gate driver coupled to the second gate line and configured to provide a second select signal for turning on the second pixel.

6. The matrix imager of claim 5, wherein:
the first gate driver is coupled to the first gate line on a first side of the matrix; and
the second gate driver is coupled to the second gate line on a second side of the matrix opposite to the first side.

7. The matrix imager of claim 5, further comprising:
a read-out circuit configured to receive the charges accumulated in the first row of pixels and generate a plurality of electrical signals accordingly;
a sequence restoring circuit configured to arrange the plurality of electrical signals in a predetermined raster pattern; and
a detection controller configured to control operations of the first gate driver, the second gate driver and the sequence restoring circuit.

8. The matrix imager of claim 1, further comprising:
a first gate driver configured to provide a first select signal for turning on the first pixel and the second pixel; and
a first row multiplexer configured to selectively couple the first gate driver to the first gate line or the second gate line.

9. The matrix imager of claim 8, further comprising:
a second gate line set comprising:
a third gate line coupled to a third pixel among a second row of pixels of the matrix;
a fourth gate line coupled to a fourth pixel among the second row of pixels of the matrix, wherein the third pixel is adjacent to the fourth pixel;

a second gate driver configured to provide a second select signal for turning on the third pixel and the fourth pixel; and
a second row multiplexer configured to selectively couple the second gate driver to the third gate line or the fourth gate line, wherein the first and second row multiplexers are arranged on opposite sides of the matrix, the first pixel and the third pixel are coupled to the first data line on a first side of the first data line, and the second pixel and the fourth pixel are coupled to the first data line on a second side of the first data line opposite to the first side of the first data line.

10. The matrix imager of claim 9, further comprising:
a read-out circuit configured to receive the charges accumulated in the first and second rows of pixels and generate a plurality of electrical signals accordingly;
a sequence restoring circuit configured to arrange the plurality of electrical signals in a predetermined raster pattern; and
a detection controller configured to control operations of the first gate driver, the second gate driver, the first row multiplexer, the second row multiplexer and the sequence restoring circuit.

11. The matrix imager of claim 8, further comprising:
a resistor circuit coupled between the first row multiplexer and the first gate line set.

12. The matrix imager of claim 1, further comprising:
a second gate line set comprising:
a third gate line coupled to a third pixel among a second row of pixels of the matrix
a fourth gate line coupled to a fourth pixel among the second row of pixels of the matrix, wherein the third pixel is adjacent to the fourth pixel;
a first gate driver arranged on a first side of the matrix;
a second gate driver arranged on a second side of the matrix opposite to the first side of the matrix;
a first row multiplexer configured to selectively couple the first gate driver to the first gate line or the third gate line
a second row multiplexer configured to selectively couple the second gate driver to the second gate line or the fourth gate line.

13. The matrix imager of claim 12, further comprising:
a read-out circuit configured to receive the charges accumulated in the first and second rows of pixels and generate a plurality of electrical signals accordingly;
a sequence restoring circuit configured to arrange plurality of electrical signals in a predetermined raster pattern; and
a detection controller configured to control operations of the first gate driver, the second gate driver, the first row multiplexer, the second row multiplexer and the sequence restoring circuit.

14. The matrix imager of claim 1, further comprising:
a second gate line set comprising:
a third gate line coupled to a third pixel among a second row of pixels of the matrix
a fourth gate line coupled to a fourth pixel among the second row of pixels of the matrix, wherein the third pixel is adjacent to the fourth pixel;
a first gate driver arranged on a first side of the matrix;
a first row multiplexer configured to selectively couple the first gate driver to the first gate line or the second gate line; and
a second row multiplexer configured to selectively couple the first gate driver to the third gate line or the fourth gate line.

15. The matrix imager of claim 14, further comprising:
a read-out circuit configured to receive the charges accumulated in the first and second rows of pixels and generate a plurality of electrical signals accordingly;
a sequence restoring circuit configured to arrange plurality of electrical signals in a predetermined raster pattern; and
a detection controller configured to control operations of the first gate driver, the first row multiplexer, the second row multiplexer and the sequence restoring circuit.

16. The matrix imager of claim 1, further comprising:
a second gate line set comprising:
a third gate line coupled to a third pixel among a second row of pixels of the matrix
a fourth gate line coupled to a fourth pixel among the second row of pixels of the matrix, wherein the third pixel is adjacent to the fourth pixel;
a first gate driver arranged on a first side of the matrix;
a second gate driver arranged on a second side of the matrix opposite to the first side of the matrix;
a first row multiplexer configured to selectively couple the first gate driver to the first gate line or the third gate line; and
a second row multiplexer configured to selectively couple the second gate driver to the second gate line or the fourth gate line.

17. The matrix imager of claim 16, further comprising:
a read-out circuit configured to receive the charges accumulated in the first and second rows of pixels and generate a plurality of electrical signals accordingly;
a sequence restoring circuit configured to arrange plurality of electrical signals in a predetermined raster pattern; and
a detection controller configured to control operations of the first gate driver, the second gate driver, the first row multiplexer, the second row multiplexer and the sequence restoring circuit.

* * * * *